United States Patent [19]

Williams et al.

[11] Patent Number: 5,523,628

[45] Date of Patent: Jun. 4, 1996

[54] APPARATUS AND METHOD FOR PROTECTING METAL BUMPED INTEGRATED CIRCUIT CHIPS DURING PROCESSING AND FOR PROVIDING MECHANICAL SUPPORT TO INTERCONNECTED CHIPS

[75] Inventors: Ronald L. Williams, San Marcos; Joe B. Tyra, Carlsbad, both of Calif.

[73] Assignee: Hughes Aircraft Company, Los Angeles, Calif.

[21] Appl. No.: 286,734

[22] Filed: Aug. 5, 1994

[51] Int. Cl.⁶ .................................................. H01L 23/10
[52] U.S. Cl. ................................ 257/777; 257/778
[58] Field of Search ........................... 257/777, 778, 257/779, 780, 667

[56] References Cited

U.S. PATENT DOCUMENTS

| | | | |
|---|---|---|---|
| 3,811,186 | 5/1974 | Larnerd et al. | 29/626 |
| 4,878,611 | 11/1989 | Lo Vasco et al. | 228/180.2 |
| 5,214,308 | 5/1993 | Nishiguchi et al. | 257/778 |
| 5,220,200 | 6/1993 | Blanton | 257/778 |

FOREIGN PATENT DOCUMENTS 0112463  4/1994  Japan ................................. 257/778

*Primary Examiner*—Rolf Hille
*Assistant Examiner*—David Hardy
*Attorney, Agent, or Firm*—W. C. Schubert; W. K. Denson-Low

[57] ABSTRACT

A method and apparatus for protecting metal bumped chips during processing and for providing mechanical support to interconnected chips. A protective adhesive stop is affixed to a metal bumped chip so that the height of the stop is at least as high as the metal bump. The stop protects the metal bump during routine handling. When the chip is interconnected to another bumped chip by cold welding their respective metal bumps, the stop contacts the face of the second chip and provides mechanical support. The stop is preferably a thermoplastic that is heated to adhere it to the second chip. The addition of the protective stop facilitates automated processing of metal bumped chips, and provides stronger, faster, and lower power chips.

17 Claims, 3 Drawing Sheets

APPARATUS AND METHOD FOR PROTECTING METAL BUMPED INTEGRATED CIRCUIT CHIPS DURING PROCESSING AND FOR PROVIDING MECHANICAL SUPPORT TO INTERCONNECTED CHIPS

BACKGROUND OF THE INVENTION

1. Field of the Invention

The present invention generally relates to the field of handling and interconnecting metal bumped integrated circuit chips, and more specifically to a method and apparatus for providing protective stops on the chips to protect the bumps during handling and to provide mechanical support to interconnected chips.

2. Description of the Related Art

To construct semiconductor devices, the chips must be handled without damaging them, and interconnected with sufficient mechanical support. In flip-chip applications semiconductor chips can be simultaneously electrically and mechanically interconnected using "cold welding" technology. The soft metal bumps, typically indium, on a chip are smashed together with the soft metal bumps on another chip, an integrated circuit board or a substrate to provide contact between the two devices.

In a flip-chip application for infrared imaging, a typical silicon readout chip includes a 644 by 480 array of transistors, each transistor has an indium bump for providing electrical contact to a detector chip. The detector chip includes an array of infrared sensitive diodes similar to the readout array, and each diode has an indium bump for contacting the readout chip. The detector chip is flipped over and interconnected to the readout chip by smashing or "cold welding" the indium bumps together to form a single contact connecting the two chips.

The diodes in the detector chip respond to the intensity of the infrared light incident on the silicon substrate and establish a potential voltage at each diode. The transistors in the readout chip output a current proportional to the potential across the respective indium contact. The indium bumps are fragile and easily damaged; the detector chips are the most susceptible to damage in standard handling.

FIGS. 1–3 illustrate a known indium bumped detector chip, and a known process for interconnecting a detector chip and a readout chip. In the sectional view shown in FIG. 1, a detector chip 10 includes an array of indium bumps 12 in electrical contact with respective diodes 13 disposed on the face of the chip. The soft metal indium bumps are exposed and fragile, and susceptible to damage during handling. As shown in FIG. 2, the detector chip is "flipped" and aligned with a readout chip 14 having an array of indium bumps 16 in electrical contact with respective transistors 15 formed on the face of the chip. Chip 10 is pressed down onto chip 14, smashing the pairs of indium bumps 12 and 16 into an array of contacts 18 connecting chip 10 to chip 14. FIG. 3 shows the interconnected chips.

The same properties of indium that facilitate cold welding for flip-chip applications also present significant problems. The metal is soft and weak, and the exposed bumps, as shown in FIG. 1, are easily damaged. These chips can not be handled with normal automated equipment. Therefore, indium bumped chips are typically handled manually, which is very slow and inefficient.

Furthermore, indium lacks sufficient strength to support the upper chip during normal handling. Currently, this problem is addressed by "wicking" the chips. This involves applying a drop of epoxy in between the chips. Normal plastics, such as epoxies, are approximately five times stronger than indium. The epoxy flows through the chips and encapsulates the indium contacts. This method provides sufficient mechanical support, but the epoxy is slow to process and adds capacitance to the electrical connection between the chips.

The capacitance is proportional to the dielectric constant of the medium between the two chips. Since the dielectric for epoxy is approximately 3.5 times that of air, encapsulating the indium contacts in epoxy increases the capacitance significantly. The additional capacitive loading increases power dissipation and decreases the speed of the chips. Quite often bubbles are formed in the epoxy, creating variable capacitances and different speeds within a circuit. For high frequency applications, the fragile unwicked chips or a different approach such as solder bumps must be used.

The interconnected chips are often encapsulated in plastic to prevent moisture from gathering on the chips. A barrier, such as epoxy, is needed to protect the bumps from the plastic encapsulation. Otherwise the encapsulation process will tear apart the chips. In these cases, the degraded electrical properties must be tolerated.

Because of the fragility of indium bumped chips, solder bumps are frequently used for general applications. A semiconductor chip with solder bumps is placed on top of another chip or substrate, and the solder is heated to form an interconnection. Solder has five times the tensile strength of indium, and is less susceptible to handling damage. However, solder has about one-third the creep strength of indium. Creep strength relates to a metals long term strength. Solder can withstand higher instantaneous loads but is very weak in terms of long-term constant loads. This creates reliability problems, and limits the overall size of solder connected chips. Additionally, solder work hardens as a result of thermal cycling and will break, whereas indium re-anneals at room temperature, and thus has a very long fatigue life. Furthermore, the spacing required between solder bump connections is far greater than for indium bumps.

SUMMARY OF THE INVENTION

The present invention seeks to provide a method and apparatus for protecting metal bumped chips during processing, and for providing a high degree of both long and short term mechanical support to interconnected chips, without significantly adding to the capacitance between the chips.

These goals are accomplished by affixing a protective adhesive stop to a metal bumped chip so that the height of the stop is at least as high as the indium bump. The stop protects the fragile indium bump during routine handling. When the chip is interconnected to another chip by cold welding the indium bumps, the stop contacts the face of the second chip and provides mechanical support.

The addition of the protective stop facilitates automated processing of indium bumped chips, and provides stronger, faster, and lower power chips.

DESCRIPTION OF THE DRAWINGS

For a better understanding of the invention, and to show how the same may be carried into effect, reference will now be made, by way of example, to the accompanying drawings in which.

DETAILED DESCRIPTION OF THE INVENTION

Figure 4:
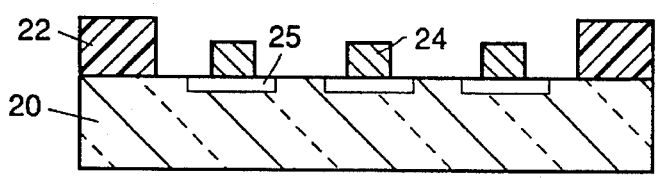
FIG. 4 is a sectional view of an indium bumped chip with a protective stop.
Figure 5:
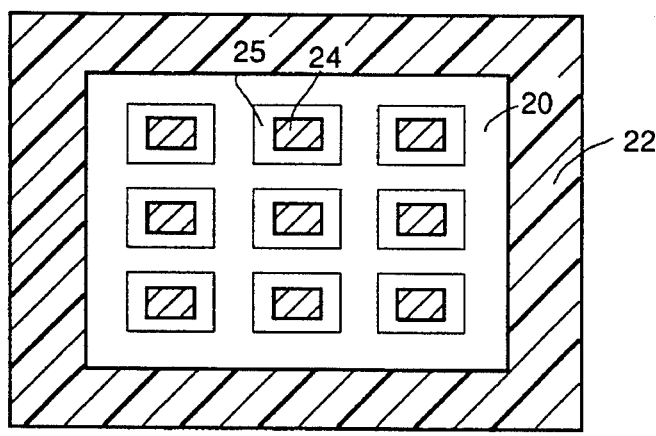
FIG. 5 is a overhead view of an indium bumped chip with a protective stop.

FIGS. 4 and 5 show an indium bumped detector chip 20 with a novel arrangement for protecting the bumps and helping to connect chip 20 to another chip. Although the invention is described in the context of infrared detection and readout chips, it is applicable in general to the flip-chip interconnection of two IC chips to each other, an IC chip to a circuit board, or an IC chip to a substrate. A detector chip 20 includes an array of indium bumps 24 in electrical contact with respective diodes 25 disposed on the face of the chip. A protective stop 22 is attached to the face of the chip and forms a ring around the edge of the chip encompassing the array of indium bumps. The stop is placed at the edge of the chip and not in contact with the indium bumps to avoid increasing the capacitance of the device. The stop has a uniform height at least as high as the indium bumps, but no more than about two microns higher.

Figure 1:
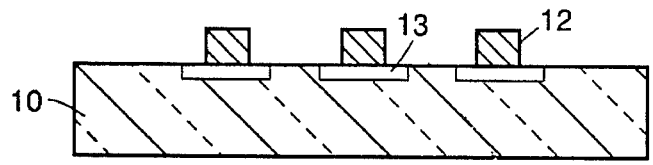
FIG. 1 is a sectional view of an indium bumped chip.
Figure 2:
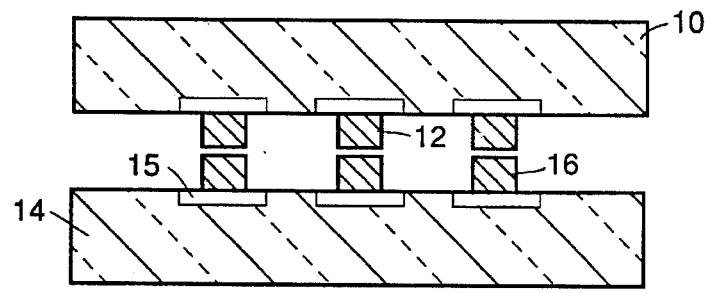
FIG. 2 is a sectional view of two indium bumped chips aligned for a flip-chip application.
Figure 3:
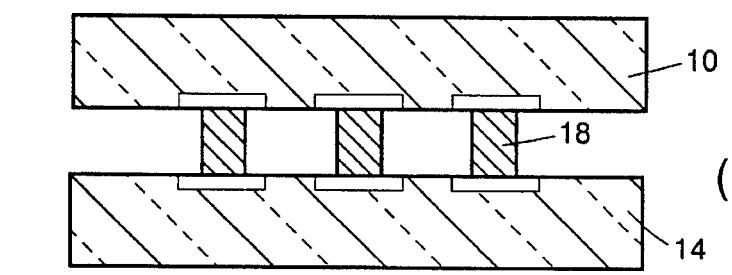
FIG. 3 is a sectional view of two interconnected indium bumped chips.

In typical automated processing, the detector chips are placed face down in a tray. This type of processing is impossible with the exposed indium bumped chips shown in FIG. 1, because the indium bumps are too fragile and smear. By adding the protective ring that protrudes further from the face of the chip than the indium bumps, the detector chips can be automatically processed without damage.

The protective stop 20 is formed from a thermoplastic adhesive. Thermoplastics are a class of resins that can be readily softened and resoftened by repeated heating. Above a threshold temperature, the thermoplastic becomes tacky and melts. Below the threshold temperature the plastic hardens. A common example of thermoplastic adhesive is hot melt glue, applied by a hot melt glue gun, and available at hardware stores.

Figure 6:
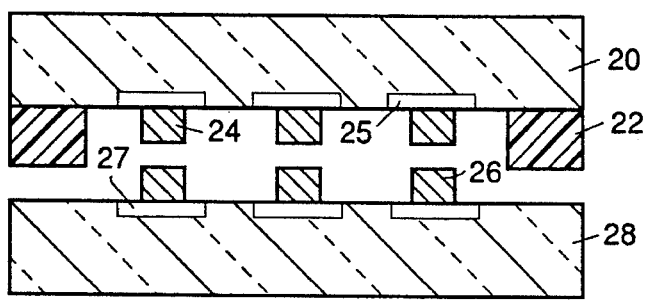
FIG. 6 is a sectional view of an indium bumped chip with a protective stop and another indium bumped chip aligned for a flip-chip application.
Figure 7:
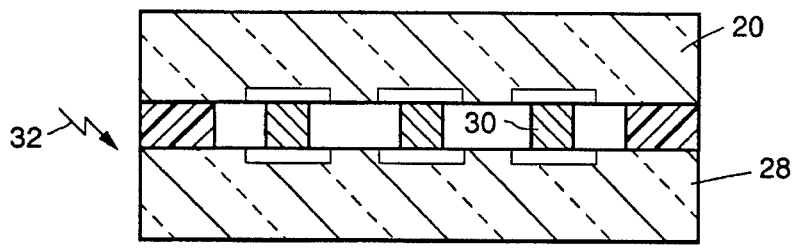
FIG. 7 is a sectional view of the chips shown in FIG. 5 after they are interconnected with each other.

In FIG. 6, detector chip 20 is flipped and positioned so that the indium bumps 24 on chip 20 are aligned with indium bumps 26 which are in electrical contact with respective transistors 27 on a readout chip 28. The indium bumps are approximately six microns high, and the protective stop preferably about seven microns high. As shown in FIG. 7, detector chip 20 has been pressed downward onto chip 28, smashing or "cold welding" the pairs of indium bumps 24 and 26 into contacts 30 connecting detector chip 24 to readout chip 26. Because the thermoplastic adhesive acts as a positive stop, the processing requirements for cold welding the two chips are less stringent. The device is heated 32 for a fraction of a second with a pulsed light beam or a heated chuck to bring the temperature of the adhesive up to its threshold temperature so that the adhesive is tacky. This seals the adhesive stop 22 to the face of chip 28 thereby sealing the cavity containing the indium bumps. The protective stop 22 provides mechanical support to the interconnected chips including supporting the weight of the top chip and providing sheer strength for device, and provides a barrier for plastic encapsulation without degrading the electrical properties of the circuit.

Modern machining techniques allow for precise control of the height of the protective stops. Furthermore, slight variations in height are overcome when the adhesive is heated and sealed to the face of the chip.

In general applications, the two chips will have circuitry other than the indium bumps such as diodes or transistors. On the top chip, the stop preferably is formed on the edge of the chip surrounding all circuitry. The circuitry on the bottom device may lie within inside the stop or in some cases under the stop. The stop is an insulator and would not degrade the electrical properties of the circuitry. However, if the circuitry extends too far from the face of the chip, the detector chip cannot be physically connected to the bottom device.

Figure 8:
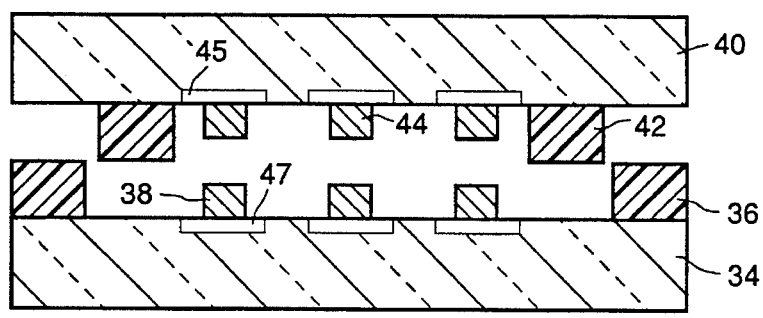
FIG. 8 is a sectional view of two indium bumped chips with protective stops aligned for a flip-chip application.

FIG. 8 shows two indium bumped chips positioned for a flip-chip application. A detector chip 40 having a protective stop 42 around indium bumps 44 which are in electrical contact with diodes 45, is flipped and aligned over a readout chip 34 having a protective stop 36 around indium bumps 38 which are in electrical contact with transistors 47. The protective stop 36 protects the indium bumped chips formed in the readout chip 34. When the two chips are interconnected, protective stops 42 and 36 are sealed to the faces of chips 34 and 40 respectively, providing additional mechanical support and protection for the indium contacts. As shown in FIG. 8, the ring formed by stop 42 lies inside the ring formed by stop 36.

Figure 9A:
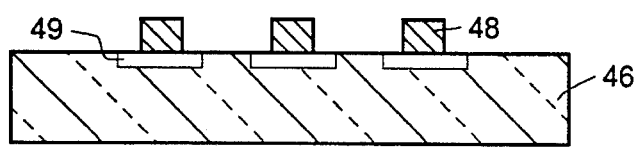
FIGS. 9a through 9f are sectional views of an indium bumped chip illustrating the method for forming a protective stop on the chip.
Figure 9B:
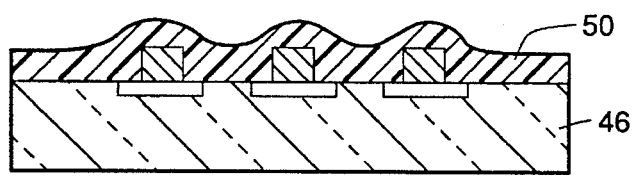
Figure 9C:
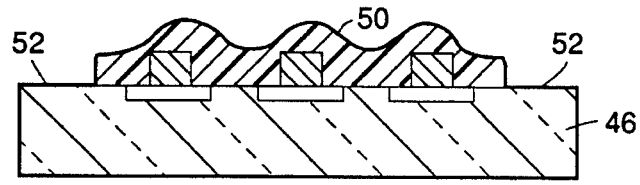
Figure 9D:
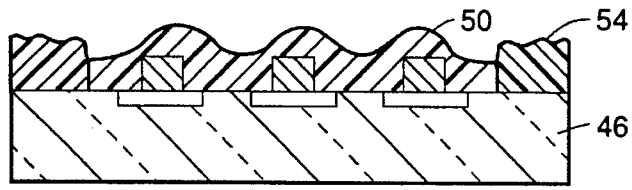
Figure 9E:
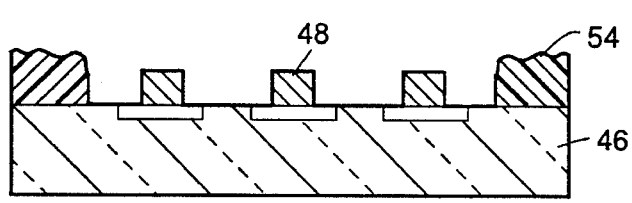
Figure 9F:
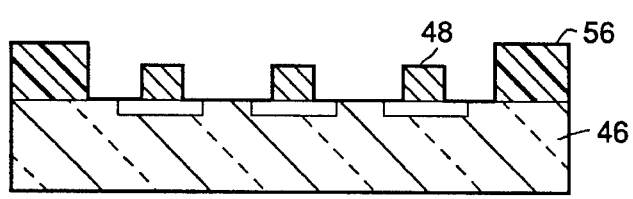

FIG. 9a through 9f are sectional views illustrating the method for forming a protective stop on an indium bump chip. FIG. 9a is a conventional indium bumped chip 46 with indium bumps 48 in electrical contact with diodes 49. In FIG. 9b a photoresist 50 has been applied to the entire face of chip 46. In FIG. 9c, the photoresist has been developed and etched to define an area 52 for depositing the adhesive. In FIG. 9d, a thermoplastic adhesive 54 has been silk screened onto the face of chip 46 in area 52 to form a ring around the indium bumps, but not in contact with the indium bumps. In FIG. 9e, the chip has been exposed to acetone to remove the photoresist. The adhesive is stable for the short time needed to removing the photoresist. The thermoplastic adhesive is screened to a nominal thickness of seven microns for six micron indium bumps. However, the thickness of the silk screened adhesive will generally be highly non-uniform. In FIG. 9f, the thermoplastic has been flattened to a uniform height of seven microns by heating a teflon coated platten and pressing it down on the adhesive, this forms a protective stop 56 around the indium bumps.

The formation of a thermoplastic protective stop on the face of a chip around the indium bumps, with the stop having a uniform height at least as high as the indium bumps, protects the indium bumps during handling and interconnection, provides mechanical support to mated chips, provides a barrier for facilitating plastic encapsulation, and does not detract from the electrical properties of the circuitry on the chips.

Figure 10:
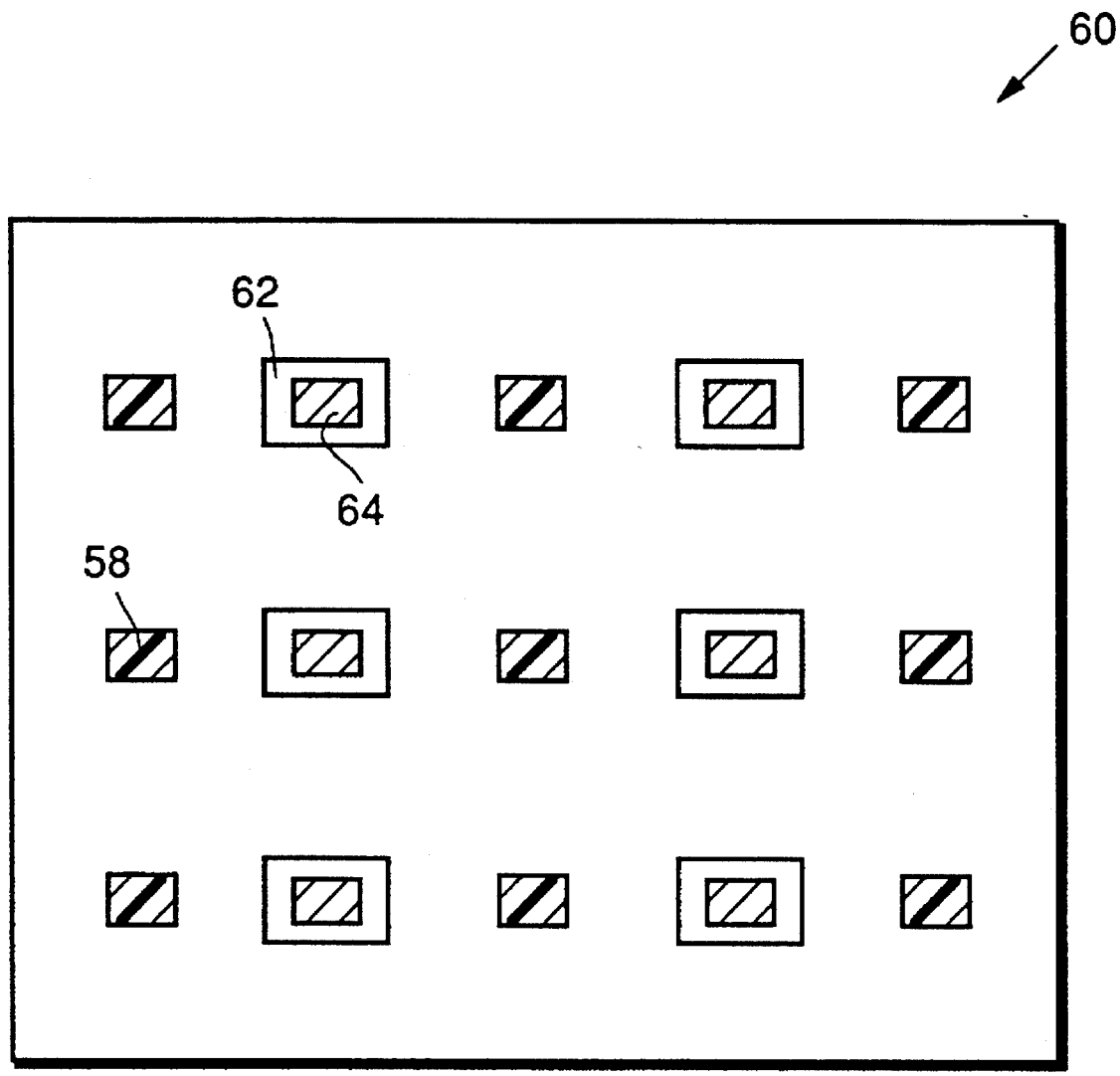
FIG. 10 is an overhead view of an indium bumped chip with a plurality of discrete protective stops.

It will be appreciated that the invention is not restricted to the embodiments that have been described and illustrated, and that variations may be made therein without departing from the scope of the invention as defined in the appended claims. For example, in a case where plastic encapsulation was not required, it might be preferable as shown in FIG. 10, to arrange a plurality of discrete stops 58 on an indium bumped chip 60 which includes diodes 62 and indium bumps 64 to provide protection and mechanical support. In addition, protective stops can be applied to solder bumped chips to provide mechanical support and form a dirt seal. The invention is applicable to the general class of semiconductor devices including gallium-arsenide devices.

We claim:

1. An integrated circuit (IC) chip suitable for flip-chip applications, comprising:

a semiconductor chip;

a plurality of metal bumps extending from a face of the chip to not more than a predetermined height; and a protective stop extending from said chip face to at least said predetermined height, said protective stop forming a continuous ring around and separated from said bumps to provide protection for said bumps.

2. An IC chip in accordance with claim 1, wherein the protective stop is an adhesive substance.

3. An IC chip in accordance with claim 2, wherein the adhesive substance is a thermoplastic.

4. An IC chip in accordance with claim 1, wherein the metal is capable of being cold welded.

5. An IC chip in accordance with claim 4, wherein the metal is indium.

6. An IC chip in accordance with claim 4, wherein the metal is solder.

7. An integrated circuit (IC) device comprising:

a first semiconductor chip;

at least one indium bump extending from a face of the first chip to not more than a predetermined height;

a protective thermoplastic stop extending from said first chip face to at least said predetermined height;

a second semiconductor chip; and at least one indium bump extending from a face of said second chip, wherein the respective indium bumps from said first and second chips are cold welded to form a single indium contact connecting the first and the second chips, the protective stop being sealed to the face of the second chip.

8. An IC device in accordance with claim 7, wherein the indium bump extend on said second chip from the face of said second chip to not more than said predetermined height, further comprising:

a second protective stop extending from said second chip face to at least said predetermined height.

9. An IC device in accordance with claim 7, wherein a plurality of said indium bumps extend from the faces of said first and second semiconductor chips, respective, to form a plurality of indium contacts, the thermoplastic protective stop forming a continuous ring around said indium contacts.

10. An integrated circuit device comprising:

a first semiconductor chip;

a plurality of solder bumps extending from a face of the first chip to not more than a predetermined height;

a protective adhesive stop extending from said first chip face to at least said predetermined height;

a second semiconductor chip; and a plurality of solder bumps extending from a face of said second chip, wherein the respective solder bumps from said first and second chips are heated to form a plurality of metal contacts connecting the first and the second chips, the protective stop being sealed to the face of the second chip.

11. An integrated circuit device in accordance with claim 10, wherein the protective adhesive stop forms a continuous ring around said metal contacts.

12. An integrated circuit device in accordance with claim 11, wherein said protective adhesive stop is separated from said metal contacts.

13. An integrated circuit (IC) chip suitable for flip-chip applications, comprising:

a semiconductor chip;

at least one metal bump extending from a face of the chip to not more than a predetermined height; and a protective stop extending from said chip face to at least said predetermined height, said protective stop being a thermoplastic and providing protection for said bump.

14. An IC chip in accordance with claim 13, wherein said metal is indium.

15. An IC chip in accordance with claim 13, wherein the protective stop comprises a plurality of discrete stop elements.

16. An IC chip in accordance with claim 13, wherein a plurality of said metal bumps extend from said chip face, the protective stop forming a continuous ring around said metal bumps.

17. An IC chip in accordance with claim 16, wherein said protective stop is separated from said metal bumps.

* * * * *